United States Patent [19]
Strauss et al.

[11] Patent Number: 6,081,172
[45] Date of Patent: Jun. 27, 2000

[54] SURFACE WAVE FILTER FOR ASYMMETRICAL/SYMMETRICAL AND SYMMETRICAL/SYMMETRICAL OPERATING MODE

[75] Inventors: Georg Strauss; Josef Bauregger, both of München, Germany

[73] Assignee: Siemens Matsushita Components GmbH & Co. KG, Munich, Germany

[21] Appl. No.: 09/242,874
[22] PCT Filed: Sep. 16, 1997
[86] PCT No.: PCT/DE97/02076
§ 371 Date: Feb. 25, 1999
§ 102(e) Date: Feb. 25, 1999
[87] PCT Pub. No.: WO98/12809
PCT Pub. Date: Mar. 26, 1998

[30] Foreign Application Priority Data

Sep. 19, 1996 [DE] Germany .......................... 196 38 370

[51] Int. Cl.[7] .................................... H03H 9/64
[52] U.S. Cl. .................... 333/193; 333/195; 310/313 D
[58] Field of Search .................. 333/193–195; 310/313 R, 313 B, 313 C, 313 D

[56] References Cited

U.S. PATENT DOCUMENTS

| | | | |
|---|---|---|---|
| 3,582,840 | 6/1971 | DeVries | 333/193 |
| 3,872,410 | 3/1975 | Zucker | 333/194 |
| 5,499,003 | 3/1996 | Davenport | 333/193 X |
| 5,585,684 | 12/1996 | Abe | 310/313 A |
| 5,592,135 | 1/1997 | Taguchi et al. | 333/195 X |
| 5,682,126 | 10/1997 | Plesski et al. | 333/195 X |
| 5,721,519 | 2/1998 | Onishi et al. | 333/193 |
| 5,874,869 | 2/1999 | Ueda et al. | 333/193 |
| 5,936,487 | 8/1999 | Solal et al. | 333/193 |

FOREIGN PATENT DOCUMENTS

| | | |
|---|---|---|
| 0 605 884 A1 | 7/1994 | European Pat. Off. . |
| 2 682 833 A1 | 4/1993 | France . |
| 28 46 510 A1 | 3/1979 | Germany . |
| 44 39 489 C1 | 1/1996 | Germany . |
| WO 97/12441 | 3/1997 | WIPO .................. 333/195 |

OTHER PUBLICATIONS

B. Wall & A. du Hamél; "Balanced Driven Transversely Coupled Waveguide Resonator Filters"; 1996 IEEE Ultrasonics Symposium, vol. 1, pp. 47–51; Conference Date Nov. 3–6, 1996, San Antonio, TX.

Primary Examiner—Robert Pascal
Assistant Examiner—Barbara Summons
Attorney, Agent, or Firm—Hill & Simpson

[57] ABSTRACT

Surface wave filter for asymmetrical/symmetrical and symmetrical/symmetrical operating mode, with interdigital output transformers (IDT2, IDT4) connected in series.

5 Claims, 5 Drawing Sheets

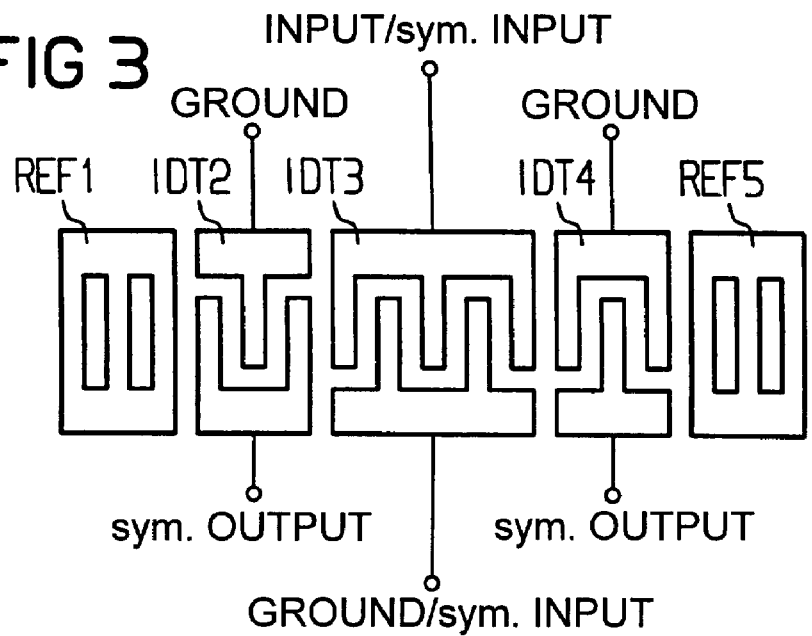
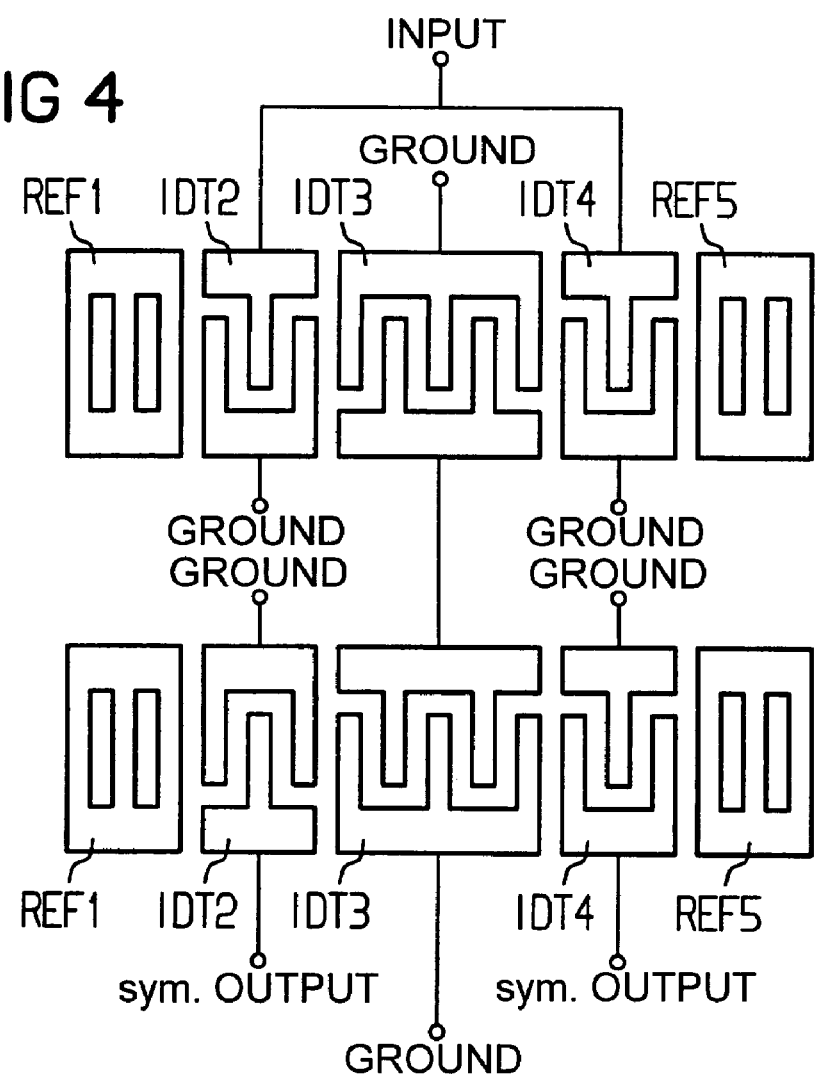

SURFACE WAVE FILTER FOR ASYMMETRICAL/SYMMETRICAL AND SYMMETRICAL/SYMMETRICAL OPERATING MODE

BACKGROUND OF THE INVENTION

The invention relates to a surface wave filter, hereafter referred to as OFW, which can be used in particular for RF applications.

In communication systems, signals are processed asymmetrically or symmetrically, whereby changes between the two operating modes often take place in the routing of the signal, and so a need arises for filters that, regarded at the input side or at the output side, can be operated asymmetrically/symmetrically or symmetrically/symmetrically. In addition, certain circuit designs require filters with the characteristics stated above, and in addition with different input and output impedances.

OFW filters that can be operated asymmetrically/asymmetrically, intended in particular for use in the RF range, are commercially available. The change from asymmetrical to symmetrical operating mode has up to now standardly been carried out by means of additional components, e.g., transformers. The impedances, i.e., the input and output impedances of these filters, are equal, and are matched by means of networks consisting of inductances and capacitances.

OFW filters that can be operated asymmetrically/symmetrically or symmetrically/symmetrically are also known. FIG. 1 shows a schematic representation of the design of such a filter, i.e., in the present case of a single-track filter with identical input and output impedances.

The structure of this OFW filter consists of an interdigital input transformer IDT3, centrically arranged, and of the reflectors REF1 and REF5, short-circuited in themselves, and interdigital output transformers IDT2 and IDT4 connected in parallel.

If the filter selectivity is to be increased, then, as FIG. 2 in turn schematically shows (identical elements are thereby designated with identical reference characters), the known single-track filter according to FIG. 1 can for example be connected in series with a filter of the same type. This filter also has identical input and output impedances and can be operated asymmetrically/symmetrically or symmetrically/symmetrically.

SUMMARY OF THE INVENTION

As already mentioned above, the underlying object of the present invention is to create OFW filters that can likewise be operated asymmetrically/symmetrically, symmetrically/symmetrically, or asymmetrically/asymmetrically, but have different input and output impedances.

For the solution of this object, in an OFW filter the invention provides that the interdigital output transformers are connected in series, and in addition are preferably mirrored to one another about the direction of propagation of the surface waves.

By means of the mirrored arrangement of the output transformers, their terminals can be applied to one side of the filter structure, and the corresponding contact paths can thereby be kept short. This contributes to a space-saving filter structure and, if necessary, reduces disturbing inductive and capacitive influences.

If, according to a further proposal of the invention, the above OFW filter is connected in series with an OFW filter consisting of a basic element with OFW single-port resonators connected in series and parallel hereto, there results a filter that can be operated asymmetrically/symmetrically or symmetrically/symmetrically, having different input and output impedances, which filter unites the high remote selectivity of the single-track filter structure with the high adjacent-channel selectivity and the low insertion loss of the connected single-port resonators.

Independent of the above OFW filter, according to a further inventive proposal a filter with identical input and output impedance, which be operated asymmetrically/symmetrically, symmetrically/symmetrically, or asymmetrically/asymmetrically, is created solely by means of the cascaded (if necessary) connection of the above basic element, which filter unites high adjacent-channel selectivity with an insertion damping that is low but that increases with an increasing number of cascaded basic elements.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawing, in which:

FIGS. 3, 4 and 5 schematically show a first, second and third embodiment of an OFW filter according to the invention;

DESCRIPTION OF THE PREFERRED EMBODIMENTS

FIG. 3 shows a structure, applied on a known piezoelectric substrate (not shown), of an OFW single-track filter with interdigital input transformer IDT3, output transformers IDT2 and IDT4 connected in series, and reflectors REF1 and REF5. By means of mirroring of the output transformers to one another about the direction of propagation of the surface waves, the separate outputs thereof are arranged on one side of the filter structure. By this means, long terminal contact paths are omitted, which reduces possible disturbing inductive and/or capacitative influences, and additionally leads to a savings of space.

By means of the series circuit of the two output transformers IDT2 and IDT4 the impedance, as sought, is increased at the output side, and is e.g., 150 Ω at 50 Ω input impedance. As is additionally required, the filter can in addition be operated asymmetrically/symmetrically or symmetrically/symmetrically.

Figure 1:
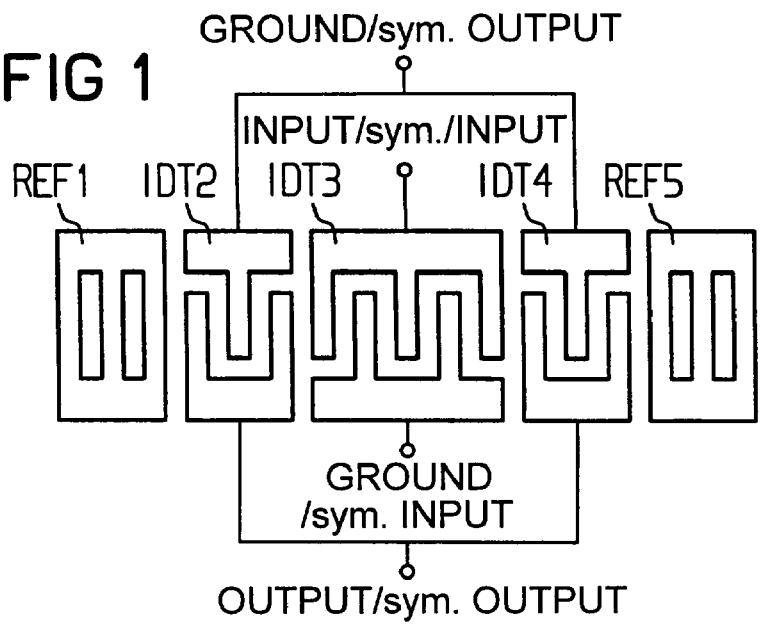
FIGS. 1 and 2 depict prior art filters.
Figure 2:
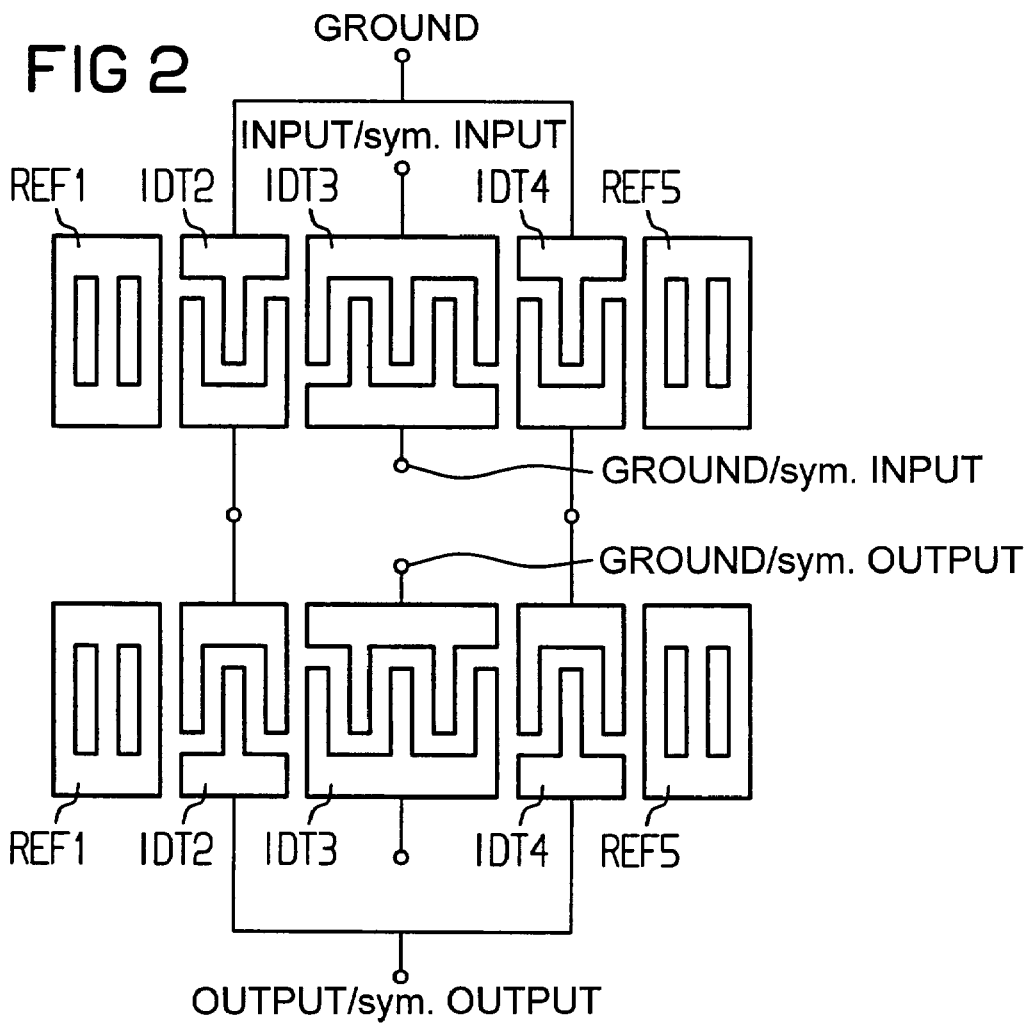

An OFW two-track filter that can be operated in the above manner, likewise with different input and output impedance, is shown in FIG. 4, whereby the single-track filter according to FIG. 3, connected in series with its output transformers, is connected in series with at least one single-track filter with interdigital output transformers connected in parallel (see FIGS. 1 and 2), in order to increase the selectivity of the filter.

Figure 5:
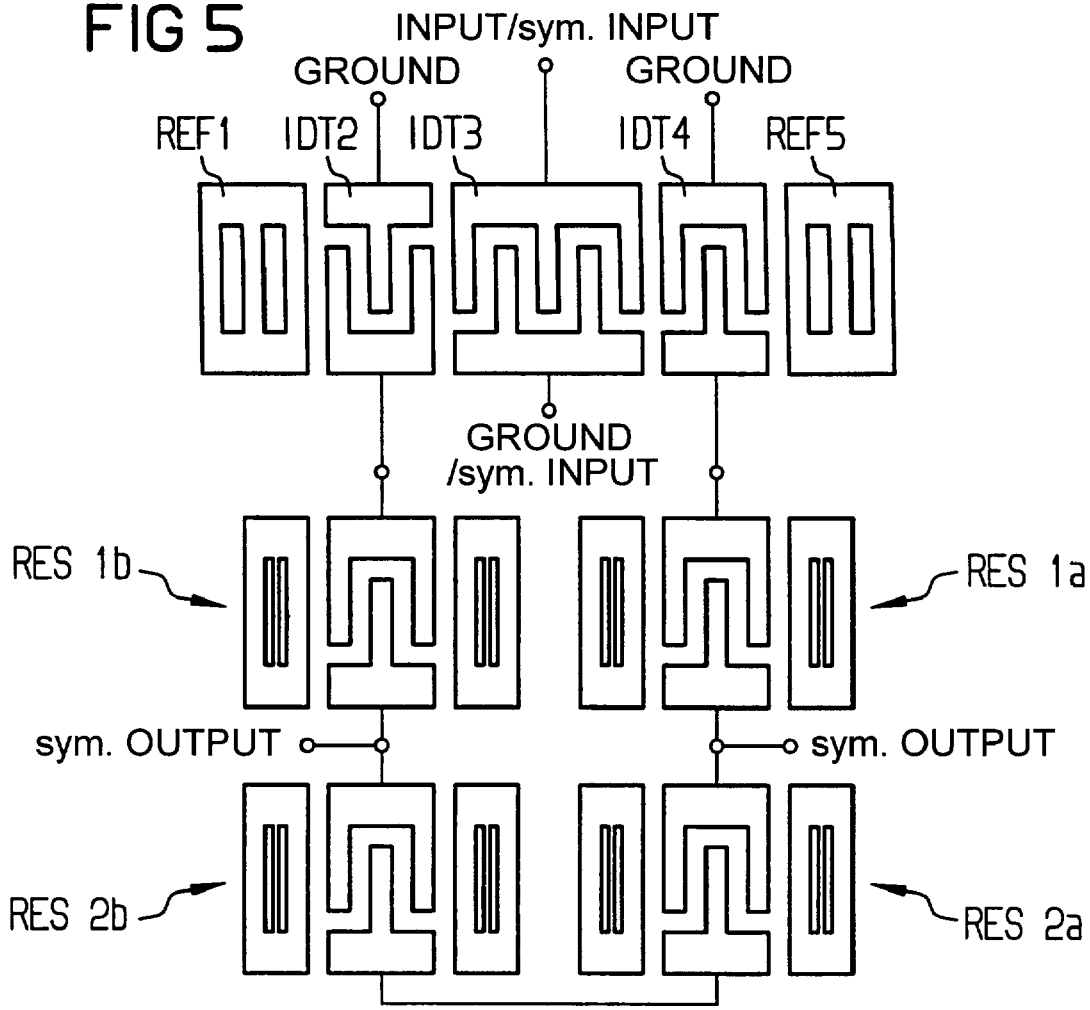
Figure 6:
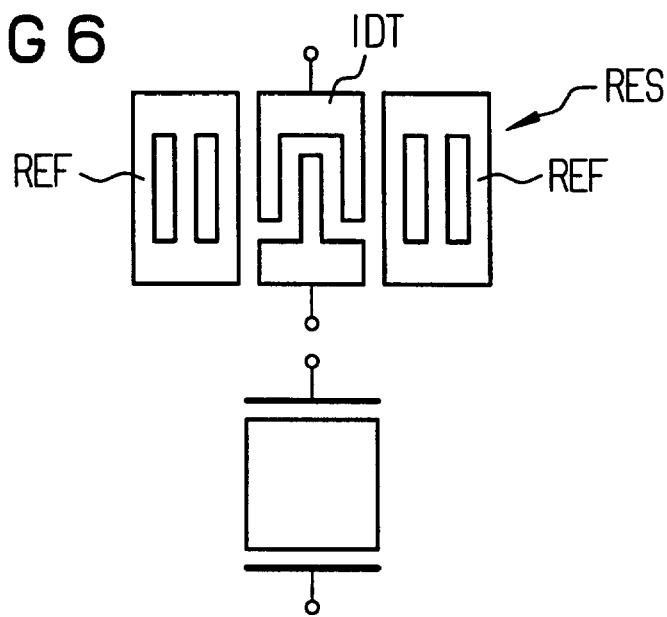
FIG. 6 schematically shows a known OFW single-port resonator.
Figure 7:
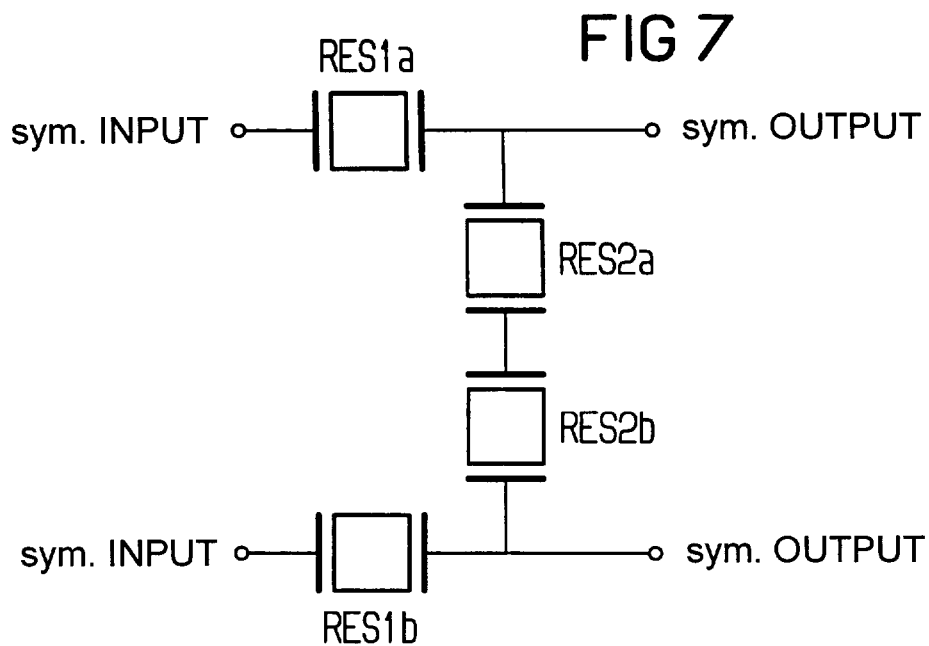
FIG. 7 schematically shows a wiring diagram of a further embodiment of an OFW filter according to the invention.

In the embodiment according to FIG. 5, the OFW single-track filter according to FIG. 3 is connected in series with an OFW filter consisting e.g. of a basic element that can among other things be operated symmetrically/symmetrically (shown separately in FIG. 7), with OFW single-port resonators RES 1a, RES 1b or, respectively, RES 2a, RES 2b, connected in series and parallel hereto (see here also the single-port resonator RES according to FIG. 6 with inter-digital transformer IDT and reflectors REF, together with the associated switching diagram).

Figure 10:
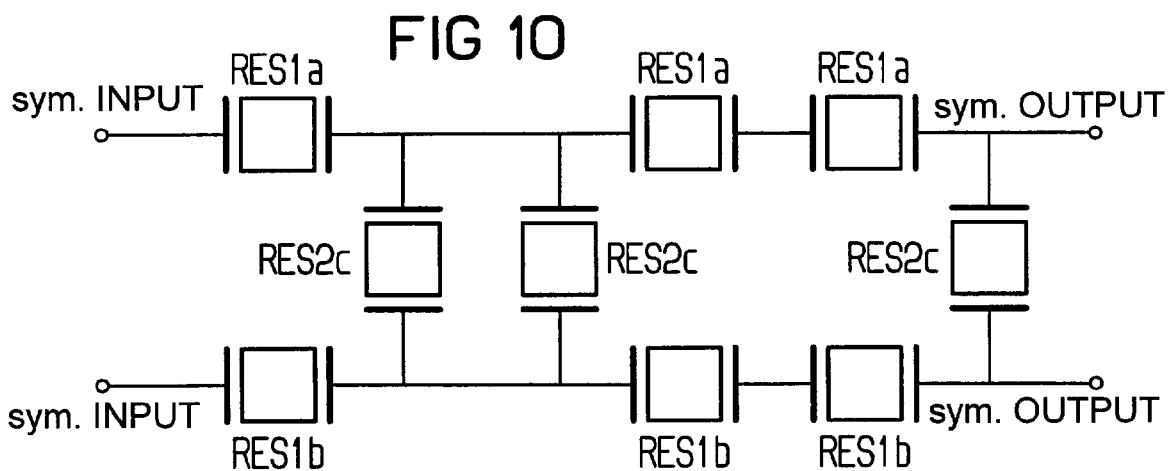

This filter likewise fulfills all the requirements according to the object of the invention. It is additionally distinguished in that it unites the high remote selectivity of the OFW single-track filter according to FIG. 3 with the high adjacent-channel selectivity and low insertion loss of the basic element. Concerning this, see the transmission characteristic according to FIG. 8 of the basic element according to FIG. 7. By means of the addition of additional basic elements, i.e., by means of a cascaded connection, as shown in FIG. 10, in addition the remote selectivity can be increased with increasing insertion loss.

Figure 9:
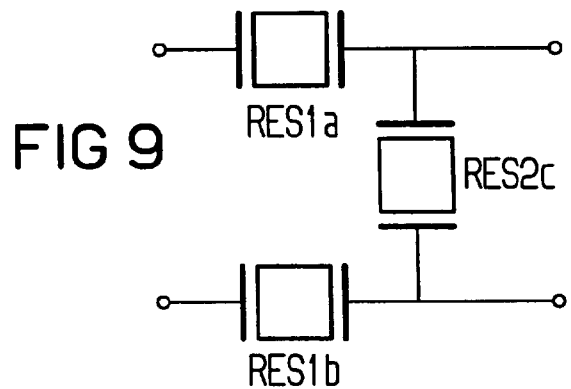
FIGS. 9, 10 and 11 schematically show further embodiments of the OFW filter according to FIGS. 5 and 7.
Figure 11:
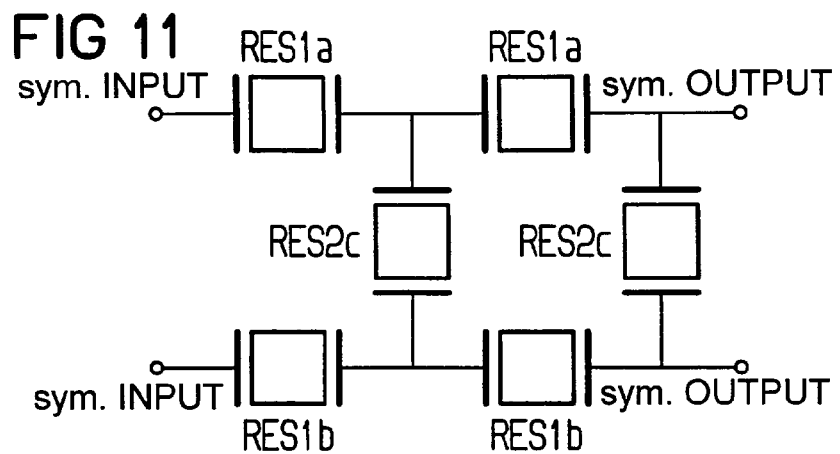

For reasons of economy of space, it is additionally desirable to replace the single-port resonators RES 2a and RES 2b, connected in parallel, respectively with an individually correspondingly dimensioned single-port resonator RES 2c, as shown in FIGS. 9 and 11.

Figure 8:
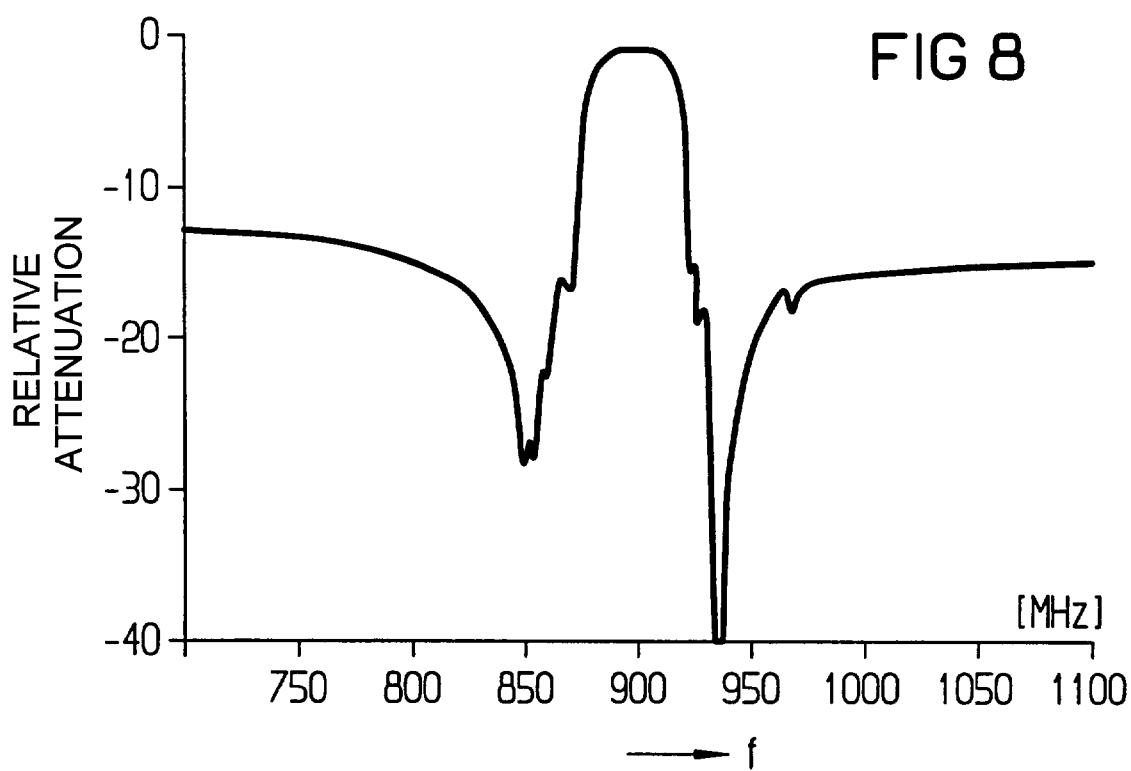
FIG. 8 schematically shows the transmission function of the OFW filter according to FIG. 7.

The specified basic element, connected in cascaded manner if warranted, is in addition usable separately, i.e. in itself, if an OFW filter is required that is to be operated e.g. only symmetrically/symmetrically. By means of the corresponding selection of the single-port resonators RES 1a, RES 1b, connected in series, and the single-port resonators RES 2a, RES 2b, connected in parallel hereto, there results the transmission characteristic of a band-pass filter, as shown in FIG. 8. The input and output impedance of this filter is equal, and is set individually by means of simple modification in particular of the aperture and finger number of the interdigital transformers.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense

What is claimed is:

1. A surface wave filter that can be operated asymmetrically/symmetrically or symmetrically, comprising:
   at least one inter-digital input transducer;
   first and second inter-digital output transducers, said first output transducer corresponds to a mirror image of said second output transducer with a propagation direction of a surface wave as axis of reflection;
   a further surface wave filter connected in series with said surface wave filter, whereby the further surface wave filter includes a basic element, said further surface wave filter includes one-gate resonators that are connected in series and one-gate resonators that are connected in parallel.

2. The surface wave filter according to claim 1, wherein basic elements are connected in cascaded fashion, consisting of surface wave single-port resonators connected in series, with surface wave single-port resonators connected in parallel, said surface wave filter having substantially identical input and output impedances.

3. The surface wave filter according to claim 1 wherein said surface wave filter further comprises, a centrically arranged interdigital input transformer with said interdigital output transformers and reflectors arranged on both sides thereof, and said interdigital output transformers are connected in series.

4. The surface wave filter according to claim 1, wherein said surface wave filter further comprises: at least one single-track filter connected in series with said surface wave filter, said at least one single-track filter having its interdigital output transformers connected in parallel.

5. The surface wave filter according to claim 1, wherein a plurality of basic elements are connected in cascaded fashion.

* * * * *